(12) United States Patent
Swam et al.

(10) Patent No.: US 7,333,606 B1
(45) Date of Patent: Feb. 19, 2008

(54) SPLITTER ARCHITECTURE FOR A TELECOMMUNICATIONS SYSTEM

(75) Inventors: Steven M. Swam, Shakopee, MN (US); Eric K. Sit, Eden Prairie, MN (US); Todd A. Morgenstern, Savage, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 09/549,133

(22) Filed: Apr. 13, 2000

(51) Int. Cl.
H04M 1/00 (2006.01)
H04M 9/00 (2006.01)

(52) U.S. Cl. .............................. 379/413.04; 379/413.02

(58) Field of Classification Search ........ 379/325–332, 379/399.01–413.04
See application file for complete search history.

(56) References Cited

U.S. PATENT DOCUMENTS

| | | | |
|---|---|---|---|
| 4,476,357 A * | 10/1984 | Malmborg et al. ....... | 200/51.09 |
| 4,552,420 A * | 11/1985 | Eigenbrode .................. | 439/92 |
| 4,815,104 A | 3/1989 | Williams et al. | |
| 4,821,150 A * | 4/1989 | Duthie et al. ................ | 361/736 |
| 4,824,383 A | 4/1989 | Lemke ........................ | 439/92 |
| 4,975,072 A | 12/1990 | Afshar | |
| 5,209,678 A | 5/1993 | Allen et al. | |
| 5,233,501 A | 8/1993 | Allen et al. | |
| 5,546,282 A | 8/1996 | Hill et al. | |
| 5,714,718 A | 2/1998 | Tanaka | |
| 5,829,130 A | 11/1998 | Miller | |
| 5,889,856 A | 3/1999 | O'Toole et al. | |
| 6,127,631 A * | 10/2000 | Green et al. ............ | 379/414.04 |
| 6,137,866 A * | 10/2000 | Staber et al. .......... | 379/414.04 |
| 6,137,880 A | 10/2000 | Bella | |
| 6,181,004 B1 | 1/2001 | Koontz et al. | |
| 6,243,273 B1 | 6/2001 | Beun et al. | |
| 6,272,219 B1 | 8/2001 | De Bruycker et al. | |
| 6,288,334 B1 | 9/2001 | Hennum | |
| 6,333,981 B1 | 12/2001 | Weir et al. | |
| 6,430,288 B1 * | 8/2002 | Frazier et al. ......... | 379/413.04 |

(Continued)

FOREIGN PATENT DOCUMENTS

CA 1316233 4/1993

(Continued)

OTHER PUBLICATIONS

Benton, R. et al., "A High-Voltage Line Driver (HVLDR) for Combined Voice and Data Services", *IEEE International Solid-State Circuits Conference*, Digest of Technical Papers, ISSCC (Cat. No. 01CH37177), vol. 44, pp. 302303, 457 (Feb. 2001).

(Continued)

*Primary Examiner*—Ramnandan Singh
(74) *Attorney, Agent, or Firm*—Merchant & Gould P.C.

(57) ABSTRACT

An interface card adapted to be mounted at the back plane of a splitter chassis. The interface card includes card edge connectors for providing connections with a splitter card. The interface card also includes cable connectors for inputting mixed voice and data, and for outputting data and voice signals. Tracings are provided on the interface card for interconnecting the cable connectors and the card edge connectors. The tracings are configured such that first tracings carrying data signals from the splitter card to the cable connectors do not cross second tracings carrying voice signals from the splitter card to the cable connectors.

35 Claims, 15 Drawing Sheets

U.S. PATENT DOCUMENTS

| | | | |
|---|---|---|---|
| 6,438,226 B1* | 8/2002 | Guenther et al. | 379/414.04 |
| 6,683,862 B1* | 1/2004 | Kim et al. | 370/342 |
| 6,996,232 B1* | 2/2006 | Staber et al. | 379/413.02 |

FOREIGN PATENT DOCUMENTS

| | | |
|---|---|---|
| EP | 0 909 102 A2 | 4/1999 |
| EP | 0 923 221 A1 | 6/1999 |
| EP | 0 967 735 A1 | 12/1999 |
| EP | 0 967 736 A1 | 12/1999 |
| EP | 1 067 687 A2 | 1/2001 |
| GB | 2 332 813 A | 6/1999 |
| JP | 04340795 | 11/1992 |
| JP | 11-205467 | 7/1999 |
| JP | 11-308352 | 11/1999 |
| JP | 200049885 | 2/2000 |
| JP | 2000151357 | 5/2000 |
| JP | 2000151470 | 5/2000 |
| JP | 2000165517 | 6/2000 |
| JP | 2000224337 | 8/2000 |
| WO | WO 99/51019 | 10/1999 |
| WO | WO 01/17203 A1 | 3/2001 |
| WO | WO 01/45432 A1 | 6/2001 |
| WO | WO 01/63893 A2 | 8/2001 |

OTHER PUBLICATIONS

Berteloot, K., "ADSL Roll-Out in Belgacom", *Br Telecommun Eng*, vol. 18, Part 2, pp. 154-158 (Aug. 1999).

Cavanaugh, K., "Splitting Out the Issues of the ADSL G.lite Initiative", *Telecommunications (Americas Edition)*, vol. 32, No. 10, pp. 45-46, 48 (Oct. 1998).

Cook, J. et al., "ADSL and VADSL, Splitter Design and Telephony Performance", *IEEE Journal on Selected Areas in Communications*, vol. 13, No. 9, pp. 16341642 (Dec. 1995).

Hawryluck, M. et al., "Efficient Equalization of Discrete Wavelet Multi-Tone Over Twisted Pair", *1998 International Zurich Seminar of Broadband Communications: Accessing, Transmission, Networking.* Proceedings (Cat. No. 98TH8277), pp. 185-191 (Feb. 17-19, 1998).

Kessler, T. et al., "Simulation of ADSL over ISDN on German Subscriber Lines", *IEEE Communications Letters* vol. 1, No. 5, pp. 124-126 (Sep. 1997).

Lenart, J. et al., "G-Lite's test run. A trial conducted by GTE shows that with microfilter technology, G. Lite proves its worth as a cost-effective DSL solution", *TELEPHONY*, vol. 236, No. 23, pp. 115-116, 118, 120 (Jun. 7, 1999).

Murase, T. et al., "Development of MegaBit Gear TE/2, CE/2 and CU/1 Local-Area ADSL Systems", *SEI Technical Review*, No. 48, pp. 32-37, (Jun. 1999).

Salamone, S., "ISDN: Give Up and Go?", *BYTE*, vol. 21, No. 2, pp. 75-80 (Feb. 1996).

Ting Sun, "Microfilter Design Promises Peaceful Coexistence Between ADSL and the Voiceband", *EDN (US Ed.)*, vol. 44, No. 25, pp. 55-56, 58, 60-61 (Dec. 9, 1999).

"High Density xDSL Central Office Splitter: PS-1000 Series", *Wilcom*, 2 pages (Apr. 2000).

Exhibit A ADC Telecommunications catalog entitled "Fiber Cable Management Products, Second Edition," dated Oct. 1995.

Exhibit B ADC Telecommunications catalog entitled "Fiber Panel Products, Second Edition," dated Jul. 1996.

Exhibit C ADC Telecommunications catalog entitled "DSX-1 Digital Signal Cross-Connect, Fourth Edition," dated Jan. 1992.

Exhibit D ADC Telecommunications catalog entitled "DSX-1 Digital Signal Cross-Connect Modules, Panels and Accessories, Sixth Edition," dated May 1998.

Exhibit E ADC Telecommunications catalog entitled "Digital Signal Cross-Connect (DSX-3) Front and Rear Cross-Connect Products," dated Feb. 1999.

Exhibit F U.S. Appl. No. 09/460,633, filed Dec. 14, 1999.

International Search Report from copending application dated Apr. 14, 2003.

Exhibit G "Telect's DS3 and DSX-3 Digital Cross-Connect Products, TELECT® Connecting the Future®," *Telect, Inc.*, http://web.archive.org/web/20000304082834/www.telect.com/lines/ds3/ds3toc.cfm, 2 pages (Date: believed to be publicly known at least as early as Nov. 12, 1999).

Exhibit H 10 Photographs of BCS II, 32-Module Positions, *Telect, Inc.*, 10 pages (Date: believed to be publicly known at least as early as Nov. 12, 1999).

* cited by examiner

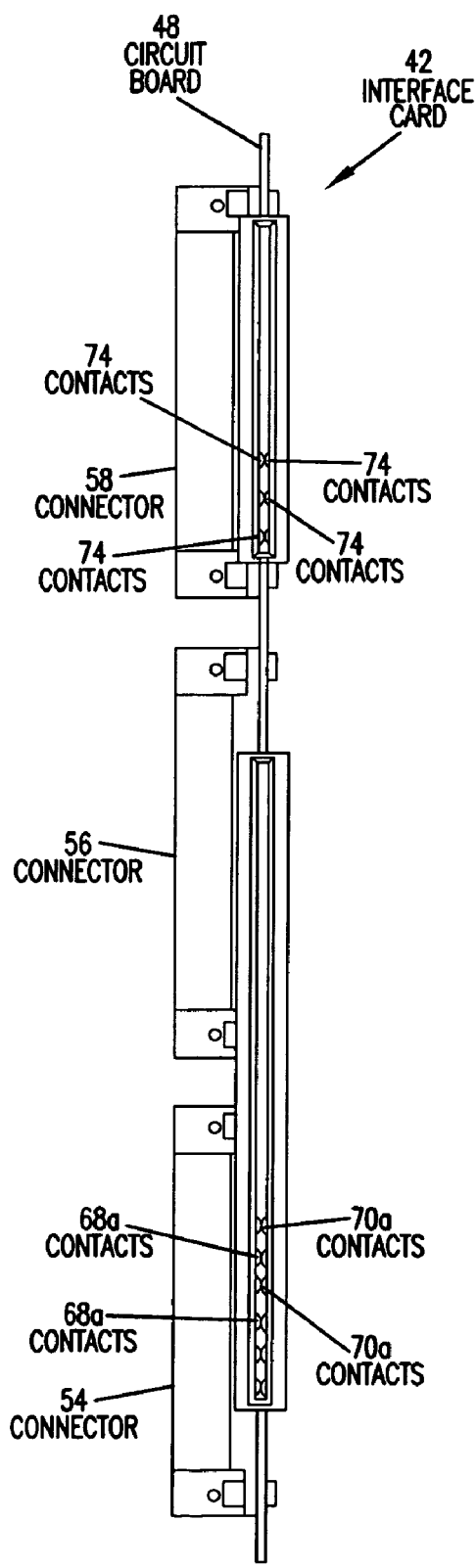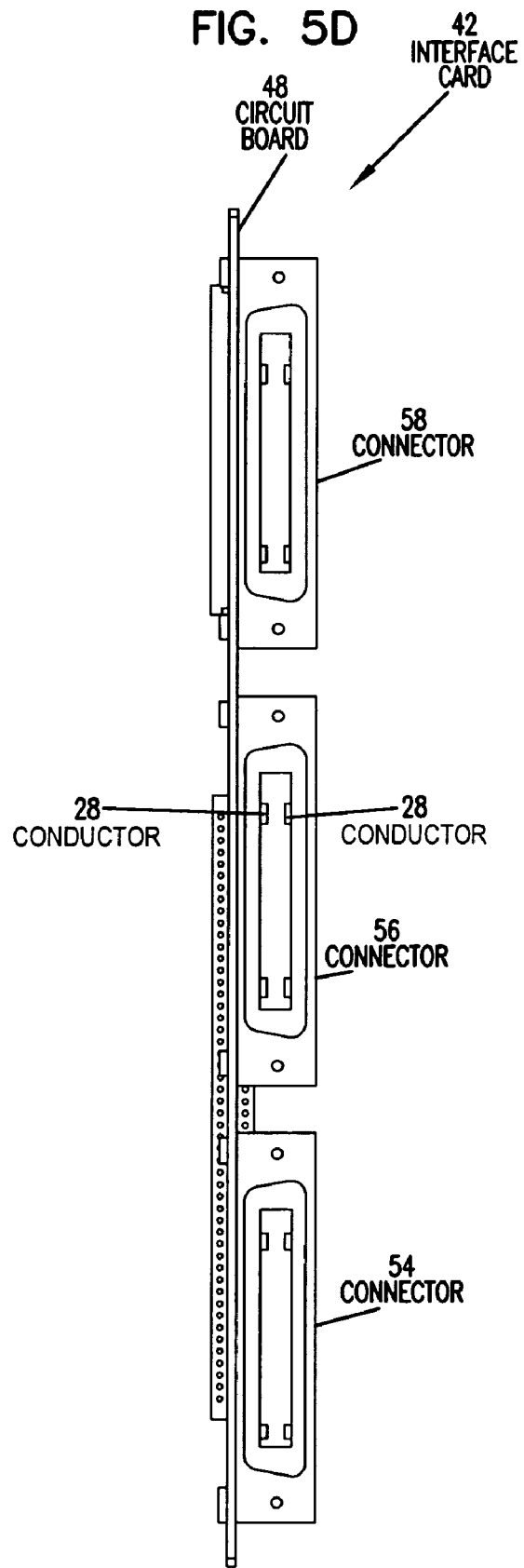

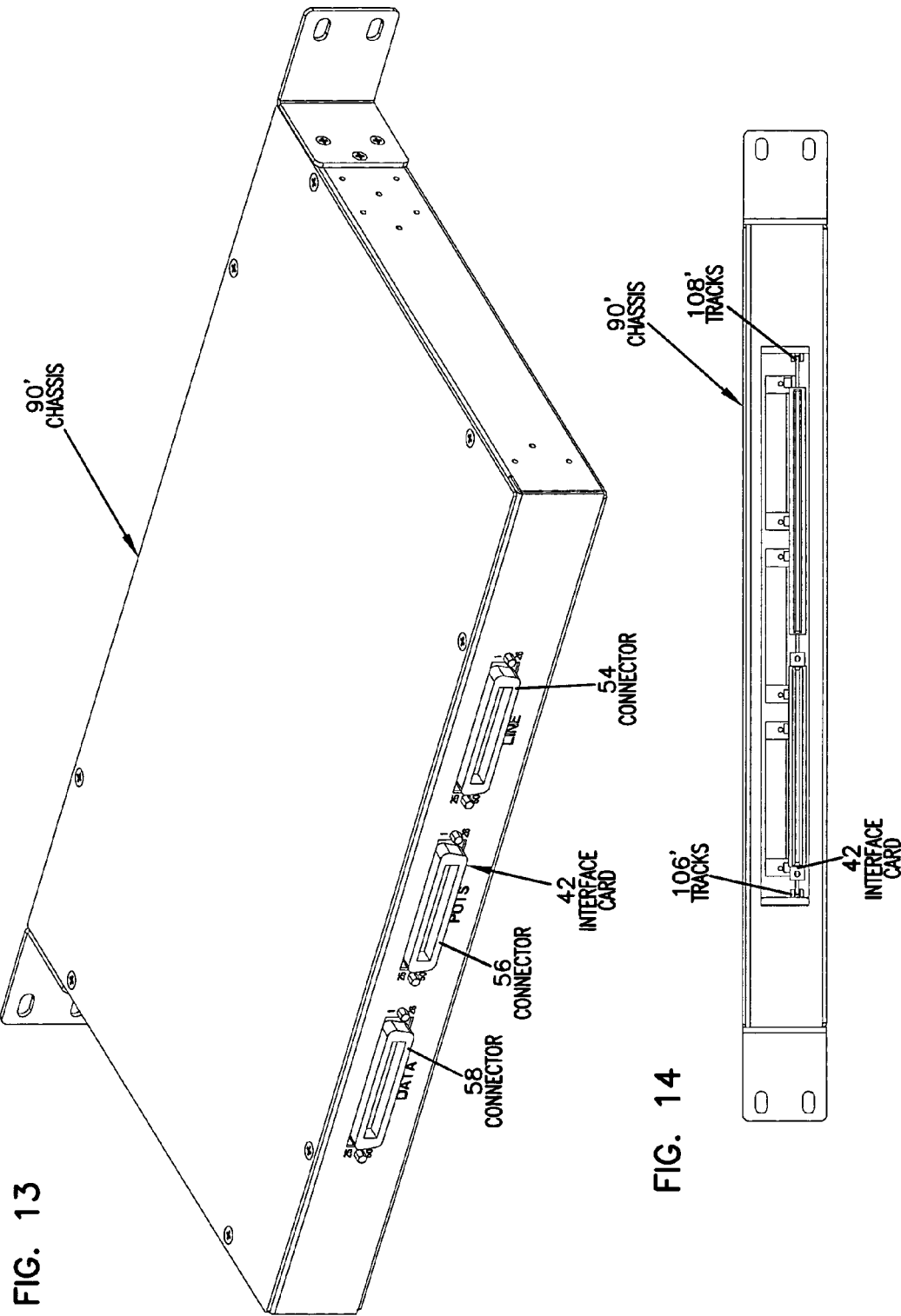

US 7,333,606 B1

SPLITTER ARCHITECTURE FOR A TELECOMMUNICATIONS SYSTEM

BACKGROUND OF THE INVENTION

Telecommunications systems commonly include cables containing bundles of twisted pairs of conductors for transmitting telecommunications signals (e.g., voice only signals, data only signals, and combined/mixed voice and data signals, etc.). In these systems, mating connectors (e.g., 25 pair Telco or Amp connectors) are used to couple the cables to telecommunications equipment for processing. In a twisted pair telephone carrier system servicing residential and/or businesses, the system may include an MDF (Main Distribution Frame), a POTS (Plain Old Telephone Service) splitter for separating voice and date signals, and a DSLAM (Digital Subscriber Line Access Multi-Plexer). For most systems, it is desirable to maximize the splitter densities. Other important considerations include scalability, serviceability, reduction of cross-talk, ease of manufacture and cost.

SUMMARY OF THE INVENTION

One aspect of the present invention relates to a splitter architecture that accommodates both scalability and serviceability for voice band and ISDN (Integrated Services Digital Network) applications of a digital subscriber line (DSL), while fully supporting lifeline POTS and lifeline ISDN service requirements. By way of example, the DSL's can include asymmetrical digital subscriber lines (ADSL) or very high speed digital subscriber lines (VDSL).

Another aspect of the present invention relates to a telecommunications system capable of providing increased splitter densities.

Still another aspect of the present invention relates to a telecommunications system including a splitter chassis having a back plane, and back plane interface cards mounted at generally perpendicular orientations relative to the back plane. The perpendicular orientation of the back plane interface cards provides for improved splitter densities, and also improves scalability by allowing the same type of back plane interface cards to be used with chassis of different sizes by merely varying the number of interface cards mounted within the chassis.

Still another aspect of the present invention relates to a back plane interface card including card edge connectors for providing connections with a splitter card. The interface card also includes cable connectors for inputting mixed voice and data, and for outputting data signals and voice signals. Tracings are provided on the interface card for interconnecting the cable connectors and the card edge connectors. The tracings are configured such that first tracings carrying data signals from the splitter card to the cable connectors do not cross second tracings carrying voice signals from the splitter card to the cable connectors.

A further aspect of the present invention relates to a telecommunications component including a circuit board, a first multi-pair cable connector, a second multi-pair cable connector, a third multi-pair connector and one or more card edge connectors. The first multi-pair connector is used to input twisted pair, mixed data/voice signal to the circuit board. The second multi-pair cable connector outputs twisted pair, voice signals from the circuit board. The third multi-pair cable connector outputs twisted pair, data signals from the circuit board. Alternatively, if the signals are to be filtered at a downstream location (e.g., at a DSLAM), the third multi-pair connector can output mixed voice and data signals. The card edge connectors include a group of normally closed contacts, and a group of normally open contacts. All of the normally opened contacts are grouped separately from the normally closed contacts. First tracings are provided on the circuit board for connecting the first multi-pair cable connector to the normally closed contacts. Second tracings are provided on the circuit board for connecting the normally closed contacts to the second multi-pair cable connector. Third tracings are provided on the circuit board for connecting the normally open contacts to the third multi-pair cable connectors. The traces are positioned such that none of the third tracings on the circuit board cross over any of the first or second tracings.

An additional aspect of the present invention relates to a chassis defining a back plane, and a back plane interface card mounted at the back plane of the chassis. The interface card includes a circuit board positioned at an orientation generally perpendicular with respect to the back plane. The interface card also includes a first multi-pair cable connector, a second multi-pair cable connector, a third multi-pair cable connector and one or more card edge connectors. The first multi-pair cable connector is positioned at the back plane for inputting twisted pair, mixed data/voice signals to the circuit board. The second multi-pair cable connector is positioned at the back plane for outputting twisted pair, voice signals from the circuit board. The third multi-pair cable connector is positioned at the back plane for outputting twisted pair, data signals or mixed data/voice signals, from the circuit board. The card edge connectors include normally closed contacts and normally open contacts. First tracings connect the first multi-pair cable connector to the normally closed contacts, second tracings connect the normally closed contacts to the second multi-pair connector cable, and third tracings connect the normally open contacts to the third multi-pair connector.

BRIEF DESCRIPTION OF THE DRAWINGS

FIGS. 5C and 5D show end views of the interface card of FIGS. 5A and 5B;

FIG. 13 is a rear perspective view of the splitter chassis of FIG. 12; and FIG. 14 is a front view of the splitter chassis of FIG. 12.

Figure 1:
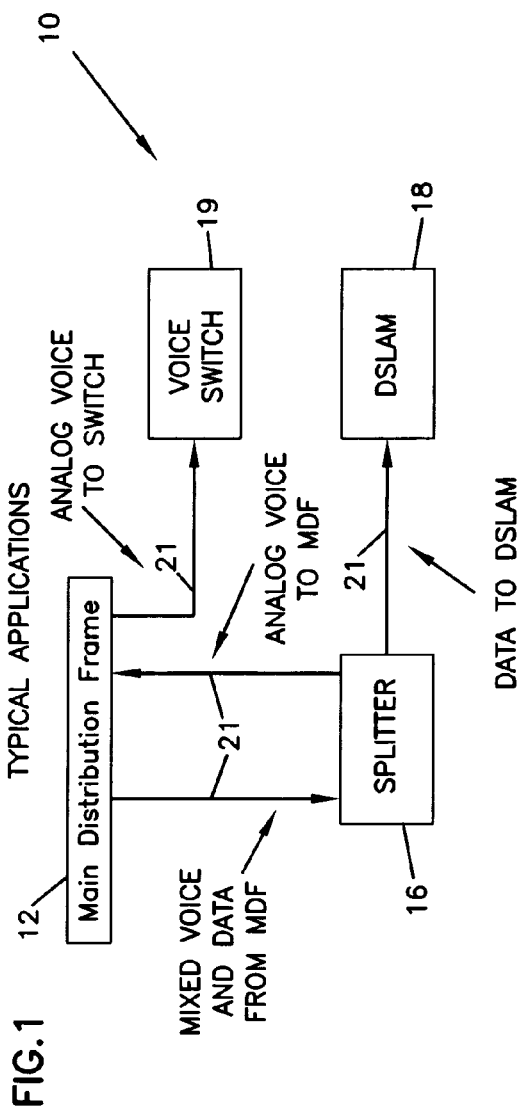
FIG. 1 is a diagram of a telecommunications system including an MDF, a splitter device, a DSLAM, and a voice switch.

While the invention is amenable to various modifications and alternative forms, specifics thereof have been shown by way of example in the drawings and will be described in detail below. It is to be understood, however, that the intention is not to limit the invention to the particular embodiments described. On the contrary, the invention is intended to cover all modifications, equivalents, and alternatives falling within the scope of the invention as defined by the appended claims.

DETAILED DESCRIPTION

In the following detailed description, references are made to the accompanying drawings that depict various embodiments in which the invention may be practiced. It is to be understood that other embodiments may be utilized, and structural and functional changes may be made without departing from the scope of the present invention.

Referring now to FIG. 1, a telecommunications system 10 is shown including an arrangement of equipment. The system 10 is representative of a telephone carrier's system for transmitting voice and data to residences and businesses. A main distribution frame (MDF) 12 is linked to a splitter device 16 (e.g., a card including POTS splitter circuits or ISDN splitter circuits). The MDF 12 is also linked to one or more DSLAM modules 18, and a voice switch 19 (e.g., a switch equipped with POTS interface line cards or ISDN interface line cards).

In use of the system 10, the splitter device 16 receives a mixed voice and data signal from the MDF 12. The splitter device 16 splits the mixed signal into split signals, and then filters the split signals. For example, one of the split signals can be filtered to provide a voice only signal (i.e., the high frequency data portion of the signal is filtered out), while the other split signal can be filtered to provide a data only signal (i.e., the low frequency voice portion of the signal is filtered out). The data only signals are passed from the splitter device 16 to the DSLAM 18. The voice only signals are passed from the splitter device 16 to the MDF 12 for transmission to the voice switch 19.

Figure 2:
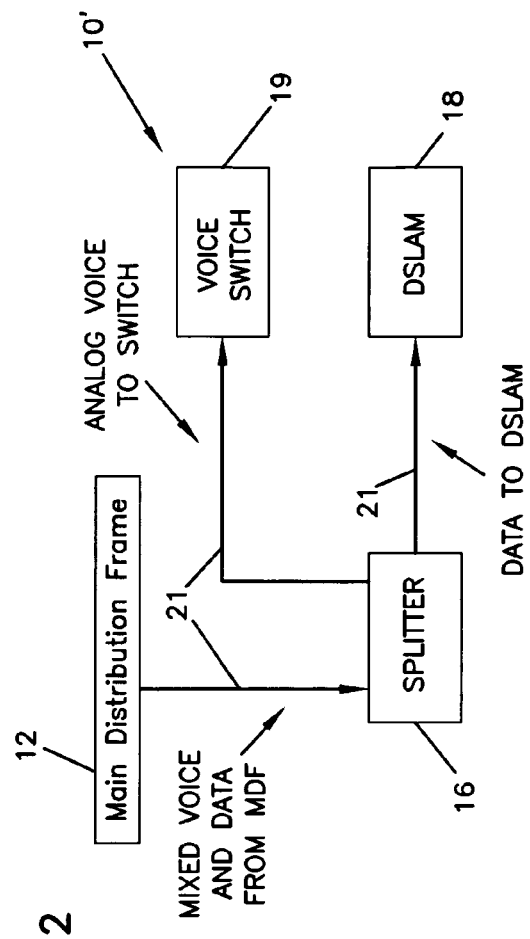
FIG. 2 is another telecommunications system including an MDF, a splitter device, a DSLAM, and a voice switch.

FIG. 2 shows a similar telecommunications system 10' having the same components as those described with respect to the telecommunications system 10' of FIG. 1. However, in the embodiment of FIG. 2, voice signals are transmitted directly from the splitter device 16 to the voice switch 19.

Referring still to FIGS. 1 and 2, the MDF 12, the POTS splitter device 16, the DSLAM 18 and the voice switch 19 are typically interconnected by cables 21. The cables 21 preferably each include multiple pairs of conductors for transmitting separate twisted pair signals. By way of example, the cables 21 can comprise 25 pair cables (i.e., cables each containing 25 pairs of wire conductors for transmitting 25 separate twisted pair signals). Multi-pair connectors are used to provide interconnections between the cables 21 and the components of the telecommunications system 10. For example, multi-pair connectors are typically provided at the ends of the cables 21. The multi-pair connectors at the ends of the cables 21 are commonly coupled to corresponding multi-pair cable connectors mounted at the equipment to provide connections therebetween.

Figure 3A:
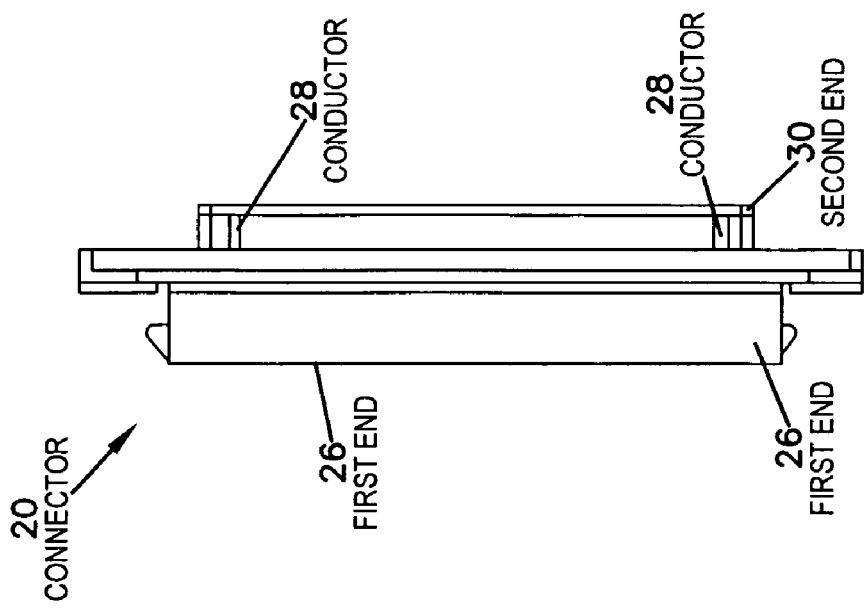
FIGS. 3A and 3B are front and side views of an exemplary twenty-five pair cable connector.
Figure 3B:
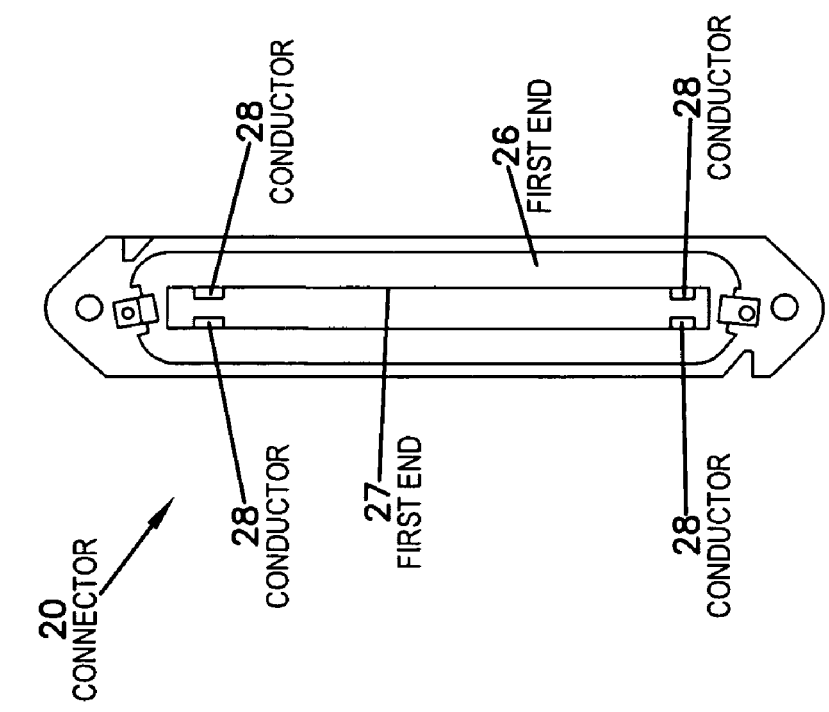

An exemplary multi-pair cable connector 20 is shown in FIGS. 3A and 3B. The depicted connector 20 is a conventional connector such as a Telco or Amp connector. Preferably, the connector 20 is adapted for use with a 25 pair cable. Thus, the conductor 20 preferably includes 25 pairs of conductors 28. For clarity, only two of the pairs of conductors 28 are shown in FIGS. 3A and 3B.

The connector 20 includes a first end 26 defining a receptacle 27 sized for receiving a portion of a mating connector (not shown) connected at the end of a cable. The pairs of conductors 28 are positioned within the receptacle 27, and are adapted to contact corresponding conductor pairs of the mating connector. The conductors 28 extend through the connector 20 from the first end 26 to a second end 30. Portions of the conductors 28 located at the second end 30 are used to provide connections to conductor pairs of cables, wires, circuit boards, equipment, etc.

The splitter 16 of FIGS. 1 and 2 can be arranged in any number of known configurations. One known splitter configuration includes a chassis having a back plane. An interface card is mounted at the back plane. The interface card includes circuit board that is parallel to the back plane of the chassis. An array of cable connectors mounted on the circuit board. The array of cable connectors includes cable connectors for inputting mixed data/voice signals to the circuit board, cable connectors for outputting voice signals, and cable connectors for outputting data signals from the circuit board. Multiple sets of card edge connectors are provided on the circuit board for allowing multiple splitter cards to interface with the circuit board. The card edge connectors include a number of normal-through connections for providing full support of lifeline POTS and lifeline ISDN services. A plurality of tracings interconnect the array of cable connectors to the sets of card edge connectors. The tracings are arranged such that first tracings carrying data signals from the splitter cards cross over second tracings carrying voice signals from the splitter cards.

The above described configuration is problematic for a number of reasons. For example, the described crossing over of tracings may increase the cross talk that occurs at the back plane. Also, the described crossing over of tracings requires the circuit board to have a relatively large number of layers thereby increasing the manufacturing costs associated with the circuit board. Further, the configuration of the back plane interface card is not readily scalable because the size of the back plane circuit board will often need to be varied to be used with chassis of different sizes.

Figure 4A:
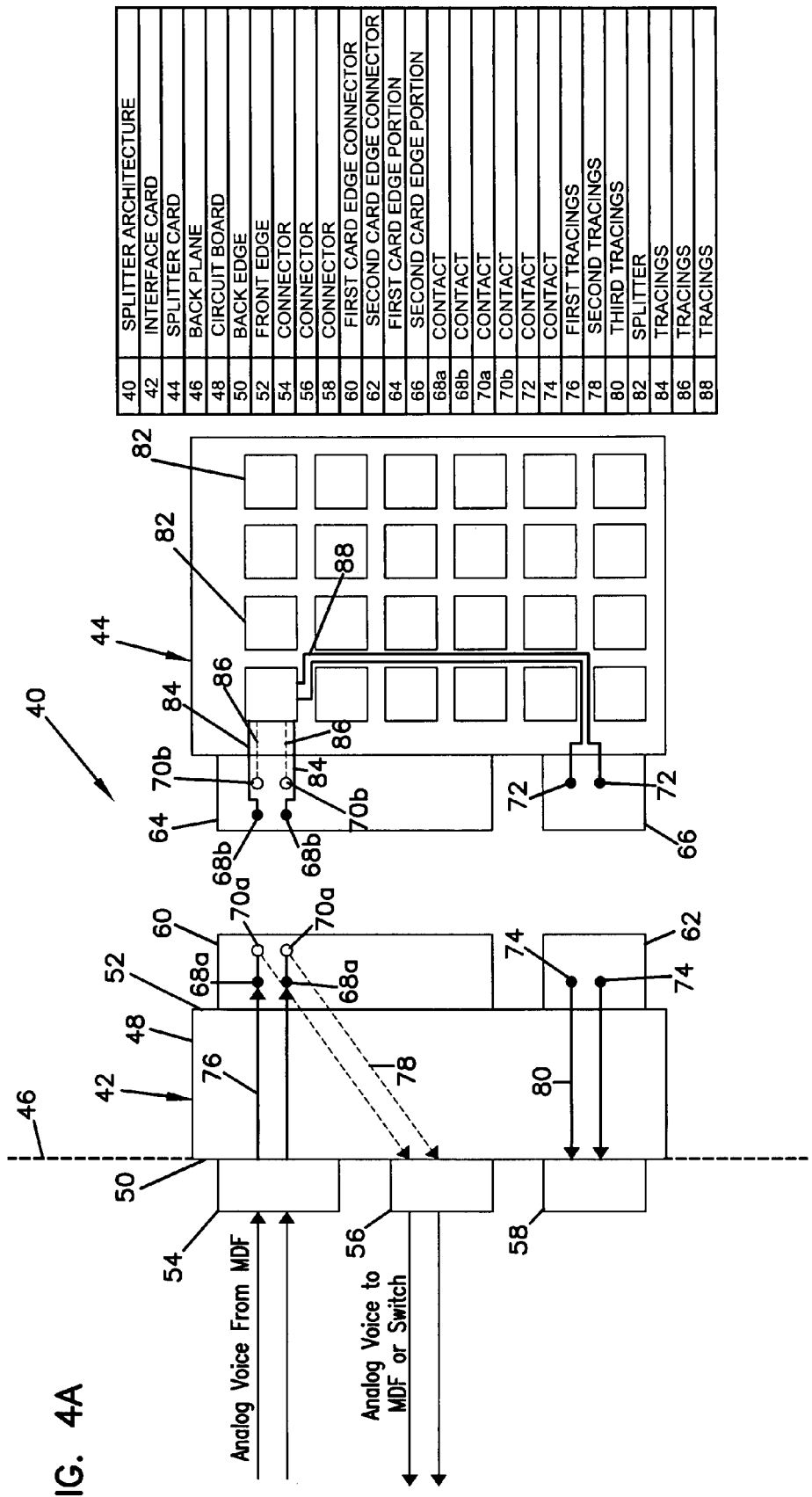
FIG. 4A is a schematic illustration of a back plane interface card and a splitter card constructed in accordance with the principles of the present invention, the back plane interface card is shown including normal-through connections for supporting lifeline services.
Figure 4B:
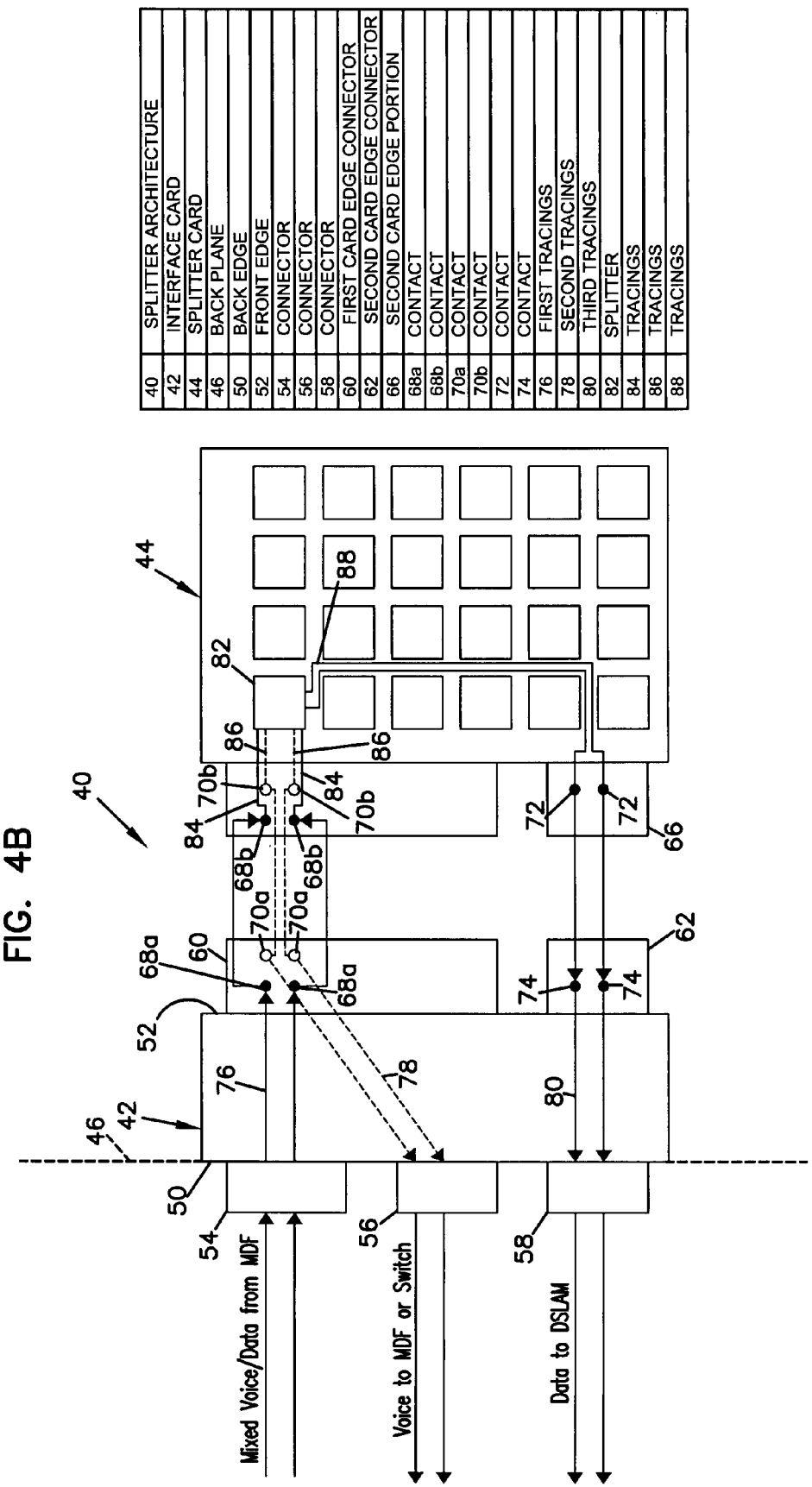
FIG. 4B shows the back plane connector card and the splitter card of FIG. 4A interconnected together.

FIGS. 4A and 4B schematically illustrate a splitter architecture 40 in accordance with the principles of the present invention. The architecture 40 is particularly useful with telecommunication service options such as asymmetrical digital subscriber lines (ADSL) and very high speed digital subscriber lines (VDSL). While the signals in the schematics are shown traveling in one direction, it will be appreciated that the system is preferably bi-directional.

Figure 5A:
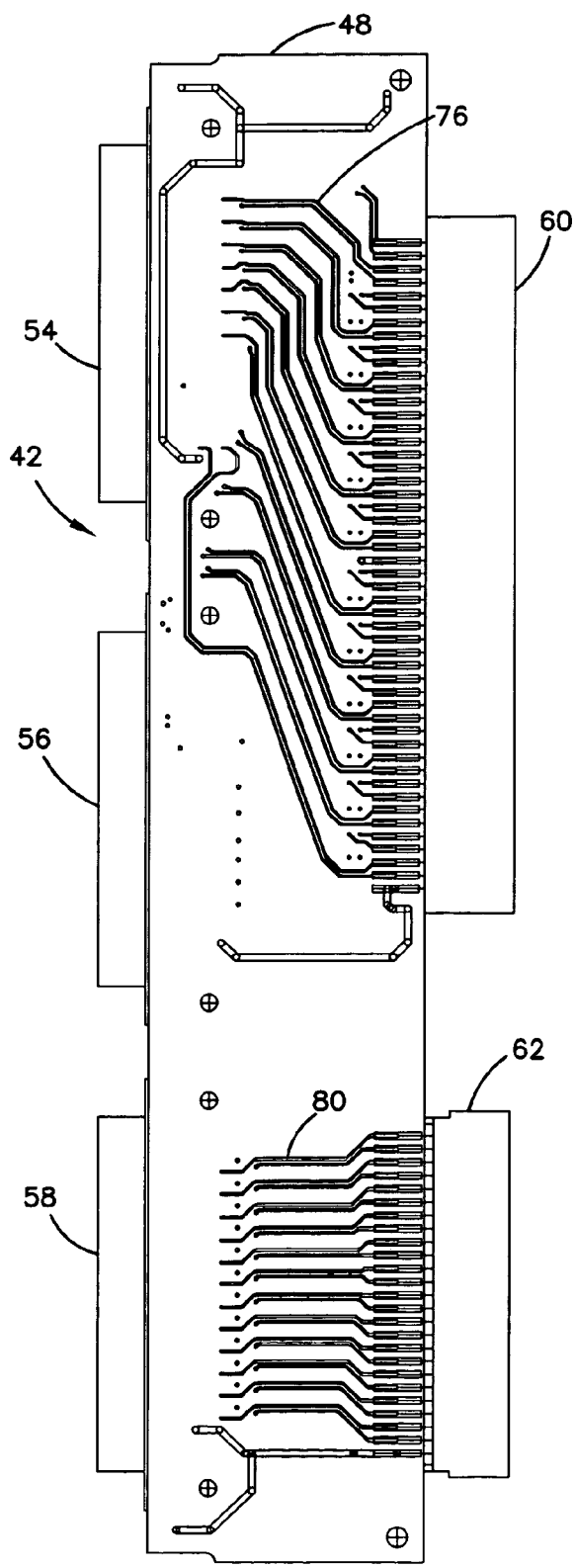
FIGS. 5A and 5B are plan views of opposite sides of an interface card constructed in accordance with the principles of the present invention, the plan views show a representative tracing pattern.
Figure 5B:
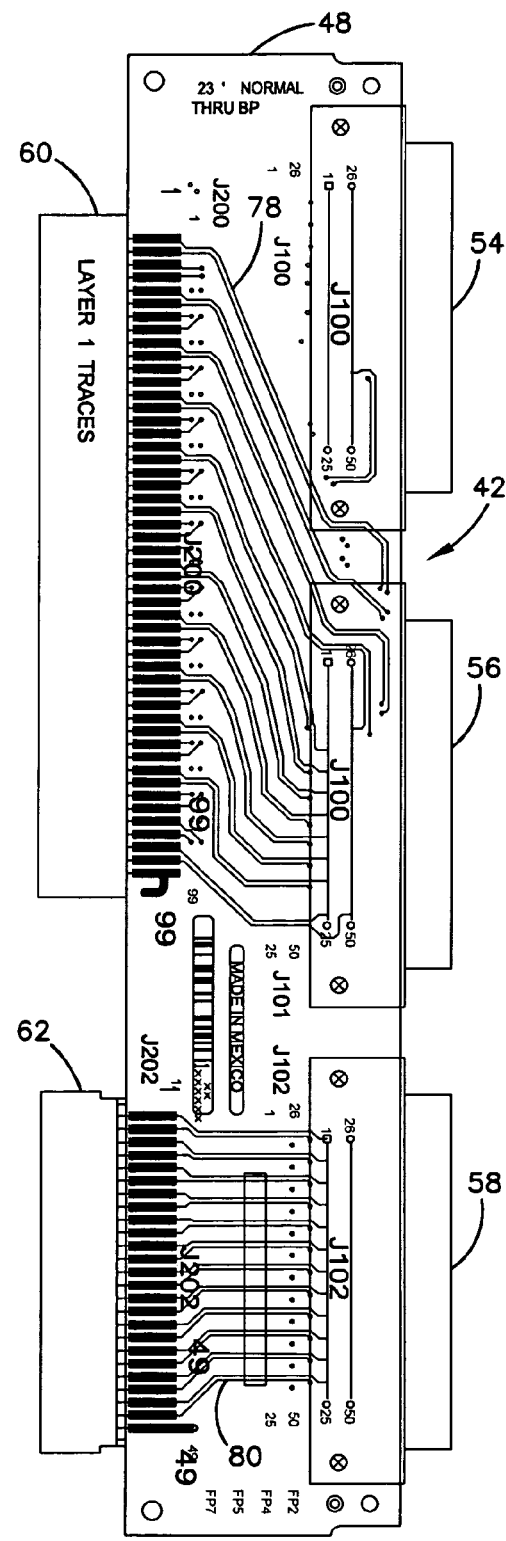

The architecture 40 includes a back plane interface card 42 adapted to couple with a splitter card 44. The interface card 42 is preferably mounted at a back plane 46 of a splitter chassis or housing, and includes a circuit board 48 adapted to align at a generally perpendicular angle relative to the back plane 46. The circuit board 48 includes a back edge 50 positioned generally at the back plane 46, and a front edge 52 that is forwardly offset from the back plane 46. First, second and third multi-pair cable connectors 54, 56, and 58 are mounted at the back edge 50, and first and second card edge connectors 60 and 62 are mounted at the front edge 52. The first cable connector 54 (i.e., a LINE connector as labeled in FIG. 8) is adapted for inputting twisted pair, mixed data/voice signals to the interface card 42. The second and third cable connectors 56 are used to respectively output twisted pair, voice signals and twisted pair data signals from the interface card 42. These connectors can be referred to as POTS (i.e., voice) and DATA Connectors as labeled in FIG. 8. The connectors 54-58 can have the same configuration as the connector shown in FIGS. 3A and 3B. Referring to FIG. 5D, a few representative conductors 28 are shown within the connectors 54-56.

The first and second card edge connectors 60 and 62 are used to provide a connection between the interface card 42 and the splitter card 44. For example, the splitter card 44 includes first and second card edge portions 64 and 66 that are respectively received within the first and second card edge connectors 60 and 62. The card edge portion 64 includes a pair of contacts 68b (e.g., contact pads) on one side of the splitter card 44, and another pair of contacts 70b (e.g., contact pads) on the other side of the splitter card 44. When the first card edge portion 64 is inserted within the first card edge connector 60, the contacts 68b and 70b engage respective contacts 68a and 70a of the first card edge connector 60. The contacts 68a and 70a, best shown in FIG. 5C, are preferably spring contacts that normally engage one another (i.e., the contacts are normally closed). FIG. 5C schematically shows a few representative contacts 68a and 70a. When the first card edge portion 64 is inserted within the first card edge connector 60, the contacts 68a and 70a are forced apart and placed into engagement with the contacts 68b and 70b of the splitter card to provide a connection therebetween.

Referring again to FIGS. 4A and 4B, the second card edge portion 66 of the splitter card 44 includes contacts 72 (e.g., contact pads) for providing a connection with the second card edge connector 62. For example, when the second card edge portion 66 is inserted into the second card edge connector 62, the contacts 72 engage respective contacts 74 provided at the second card edge connector 62 to provide a connection therebetween. The contacts 74 are preferably normally open (i.e., no signals are passed through the contacts 74 unless the splitter card 44 is coupled to the interface card 42). FIG. 5C schematically shows a few representative few contacts 74. As shown in FIG. 5C, the contacts 74 include two groups separated by a gap sized for receiving the card edge portion 66. Thus, the groups of contacts 74 are adapted for engaging contacts 72 located on opposite sides of the splitter card.

For clarity purposes, only one twisted pair circuit for the splitter architecture is shown in FIGS. 4A and 4B. Thus, only single pairs of the contacts 68a, 68b, 70a, 70b, 72 and 74 are shown. However, it will be appreciated that the actual number of contacts provided will be dependent upon the capacity of the connectors 54, 56, and 58; and the number of splitters provided at the splitter card 44. For example, if the cable connectors 54-56 and 58 comprise conventional 25 pair connectors, 24 separate pairs of the contacts 68a, 68b, 70a, 70b, 72 and 74 are preferably provided. In such a case, the twenty fifth pair of conductors in the cable connectors is preferably grounded or inactive. Thus, in such an embodiment, the splitter architecture 40 has the capacity to process 24 separate twisted pair signals. Of course, the capacity of the splitter architecture 40 can be varied. For example, in certain embodiments it may be desirable to provide more or fewer splitters at the splitter card 44 (e.g., any number of splitters can be provided such as 8, 24, 48, 96, etc.). Thus, the number of separate circuit paths provided by the splitter architecture 40 can be varied accordingly.

With respect to the splitter card 44, it is preferred for all of the contacts 68b and 70b to be grouped separately from the contacts 72. For example, all of the contacts 68b and 70b of the splitter card are preferably provided on the first card edge portion 64, while all of the contacts 72 of the splitter card are preferably provided at the second card edge portion 66. In a card with 24 splitters, 48 of the contacts 72 can be provided at the second card edge portion 66, and 48 of each of the contacts 68b and 70b can be provided at the first card edge portion 64.

Referring still to FIGS. 4A and 4B, the cable connector 54 is connected to the pair of contacts 68a by first tracings 76; the pair of contacts 70a is connected to cable connector 56 by second tracings 78; and the pair of contacts 74 is connected to cable connector 58 by third tracings 80. Once again, for clarity and ease of explanation, the circuit pathway for only a single twisted pair signal has been illustrated in FIGS. 4A and 4B.

FIGS. 5A-5D show the back plane interface card 42 equipped with 24 separate circuits capable of handling 24 different twisted pair signals. In the embodiment of FIGS. 5A-5D, all of the normally closed contacts 68a and 70a are provided at the first card edge connector 60, and all of the normally open contacts 74 are provided at card edge connector 62. Thus, the normally closed contacts 68a and 70a are grouped separately from the normally open contacts 74. This particular configuration is advantageous because a more simplified tracing layout can be used. For example, because the normally closed contacts 68a and 70a are grouped separately from the normally open contacts 74, none of the third tracings 80 are required to cross over any of the first or second tracings 76 and 78. This helps reduce manufacturing costs by reducing the number of layers required to manufacture the circuit board 48. Additionally, the reduction in crossing of the tracings may assist in reducing cross talk at the back plane 46.

Figure 5E:
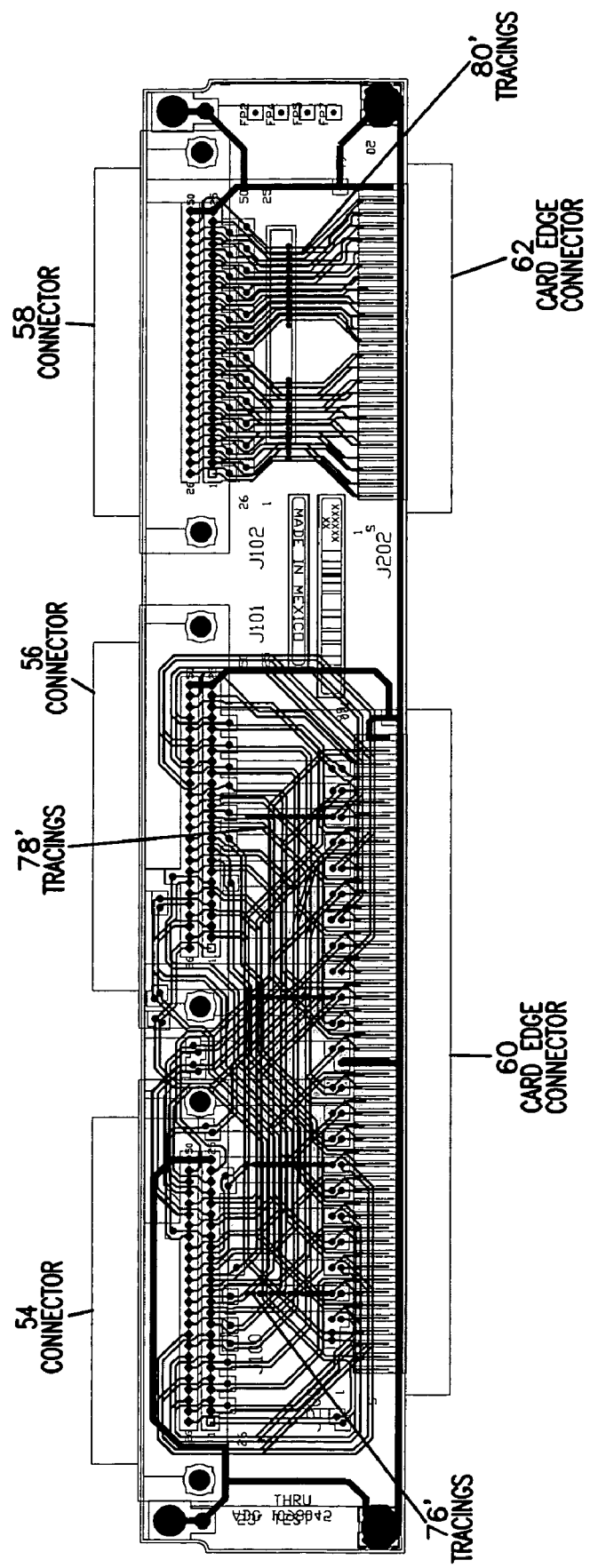
FIG. 5E shows a multi-layer tracing layout for an interface card having a slightly different tracing pattern than the embodiment of FIGS. 5A and 5B.

FIG. 5E shows a multi-layer view of another interface card 42' constructed in accordance with the principles of the present invention. The card has a similar construction as the card 42 shown in FIGS. 5A-5D. For example, both cards include cable connectors 54-56, as well as card edge connectors 60 and 62. Also, card 42' has tracings 76', 78' and 80' that serve the same functions as tracings 76, 78 and 80 of the card 42; but are arranged in a slightly different pattern. As previously described with respect to tracings 76-80, tracings 76', 78' and 80' are preferably configured such that none of tracings 80' cross over any of tracings 76' and 78'.

As shown in FIGS. 5A-5E, the normally open and closed contacts are grouped separately by placing such contacts on separate connectors. It will be appreciated that alternative grouping techniques can also be used. For example, the normally open and closed contacts can be separately grouped (i.e., not mixed or alternated) on a common connector. In one embodiment, all of the contacts can be grouped separately on a single connector. Additionally, for some applications, it may be desirable to use more than two connectors. For example, the group of normally closed connectors could be split between two connectors and the open contacts could be provided on a third connector.

Referring back to FIGS. 4A and 4B, the splitter card 44 includes a plurality of splitters 82 (e.g., 24 splitters) The contacts 68*b*, 70*b* and 72 are shown connected to one of the splitters 82 by tracings. For example, tracings 84 connect the contacts 68*b* to the splitter 82, tracings 86 connect the contacts 70*b* to the splitter 82, and tracings 88 connect the contacts 72 to the splitter 82. While not shown for clarity purposes, it will be appreciated that similar contacts and tracings are provided for each of the twenty four splitters 82 shown in FIGS. 4A and 4B.

The splitters 82 can have a number of different configurations. For example, the splitters 82 can comprise POTS splitter circuits. A conventional POTS circuit functions to split a composite signal (i.e., a mixed voice/data signal) into two composite signals. One of the split composite signals is typically passed through one or more low pass filters capable of passing the relatively lower frequency voice content of the composite signal (e.g., less than about 4 kHz) and rejecting the composite signal content above the voice band (e.g., 30 kHz and above). The other split composite signal can be passed through a high pass filter that passes the composite signal content associated with the data band (e.g., about 30 kHz and above), and rejects the relatively lower frequency voice content of the composite signal. Alternatively, the other split signal can be unfiltered such that the signal remains a composite signal. For such an embodiment, it is assumed that the DSLAM or other digital multi-plexer that ultimately receives the composite signal will provide any required high-pass filter elements to remove the relatively low frequency voice signal content of the composite signal. It will further be appreciated that ISDN filter circuits could also be used.

FIGS. 4A and 4B show two modes of operation for the back plane interface card. FIG. 4A shows the back plane interface card 42 in a normally closed mode in which the interface card 42 is not connected to the splitter card 44. In such a mode, an analog voice signal (e.g., from an MDF) is inputted to the interface card 42 through connector 54. Once at the interface card 42, the voice signal is transmitted through the first tracings 76 to contact 68*a*. Because the splitter card 44 is not connected to the interface card 42, the contacts 68*a* and 70*a* are closed. Thus, the voice signal is transmitted through the contacts 68*a* and 70*a* to the second tracings 78. From the second tracings 78, the voice signal is transmitted through connector 56 and is outputted to another piece of equipment (e.g., an MDF or switch). In this manner, the normally closed contacts 68*a* and 70*a* at the card edge connector 60 fully support lifeline POTS and lifeline ISDN services.

FIG. 4B shows the splitter card 44 connected to interface card 42. When the splitter card 44 is connected to the interface card 42, the normally closed contacts 68*a*, 70*a* are opened and placed into respective engagement with contacts 68*b* and 70*b* of the splitter card 44. Also, contacts 74 of the second card edge connector 62 are concurrently closed (i.e., the contacts 74 are placed into engagement with contacts 72 of the splitter card 44). Thus, a composite signal inputted through connector 54 will be transmitted from cable connector 54 to the splitter 82 via tracings 76 and 84. At the splitter 82, the composite signal is preferably split and filtered such that a voice only signal is transmitted through tracings 86, and a data only signal is transmitted through tracings 88. The voice only signal is transmitted from tracings 86 through contacts 70*b* and 70*a* to tracings 78. From tracings 78, the voice only signal is outputted from cable connector 56 to a piece of equipment (e.g., an MDF or switch). The data only signal is transmitted through contacts 72 and 74 to tracings 80. From tracings 80, the data only signal is output through connector 58 to a piece of equipment (e.g., a DSLAM).

Figure 6:
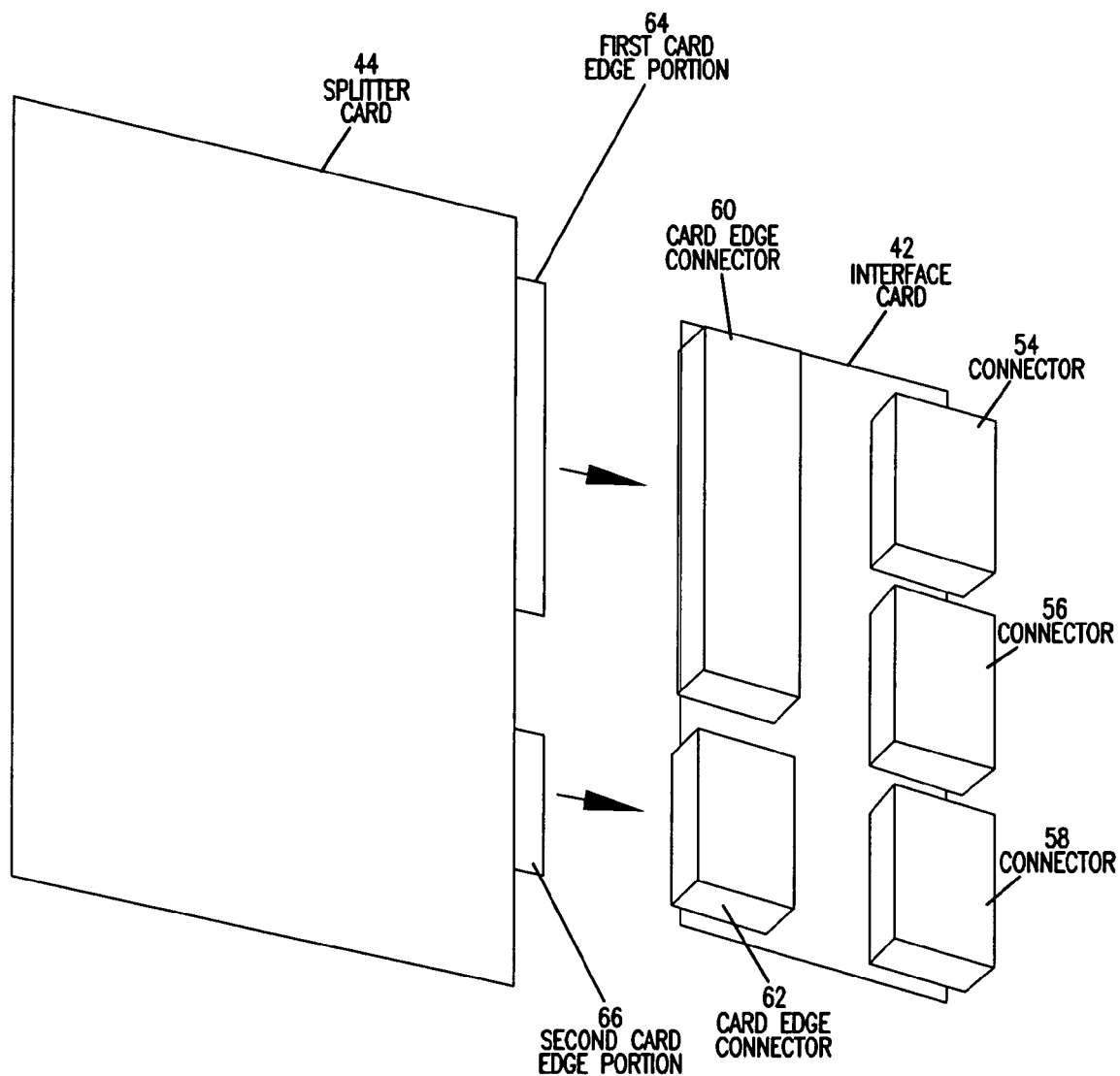
FIG. 6 is a schematic depiction of an inventive configuration for a back plane interface card and a splitter card, both the back plane interface card and the splitter card are aligned at a generally perpendicular orientation relative to a chassis back plane.

FIG. 6 is a schematic illustration showing the relative orientations between the back plane interface card 42 and the splitter card 44. As shown, when the splitter card 44 is connected to the interface card 42, the two cards are aligned generally parallel with respect to one another. Thus, as so positioned, both of the cards 42 and 44 are aligned perpendicular relative to the back plane 46 of the chassis. Such a configuration has been found to assist in greatly increasing the splitter density of a given chassis. Such a configuration also improves scalability by allowing the signal sized uni-faced cards 42 to be used with chassis of different sizes. Further flexibility can be provided by either mounting the back plane interface cards 42 in a side by side relationship within a chassis, or by stacking the interface cards 42 one on top of the other within a chassis.

Figure 7:
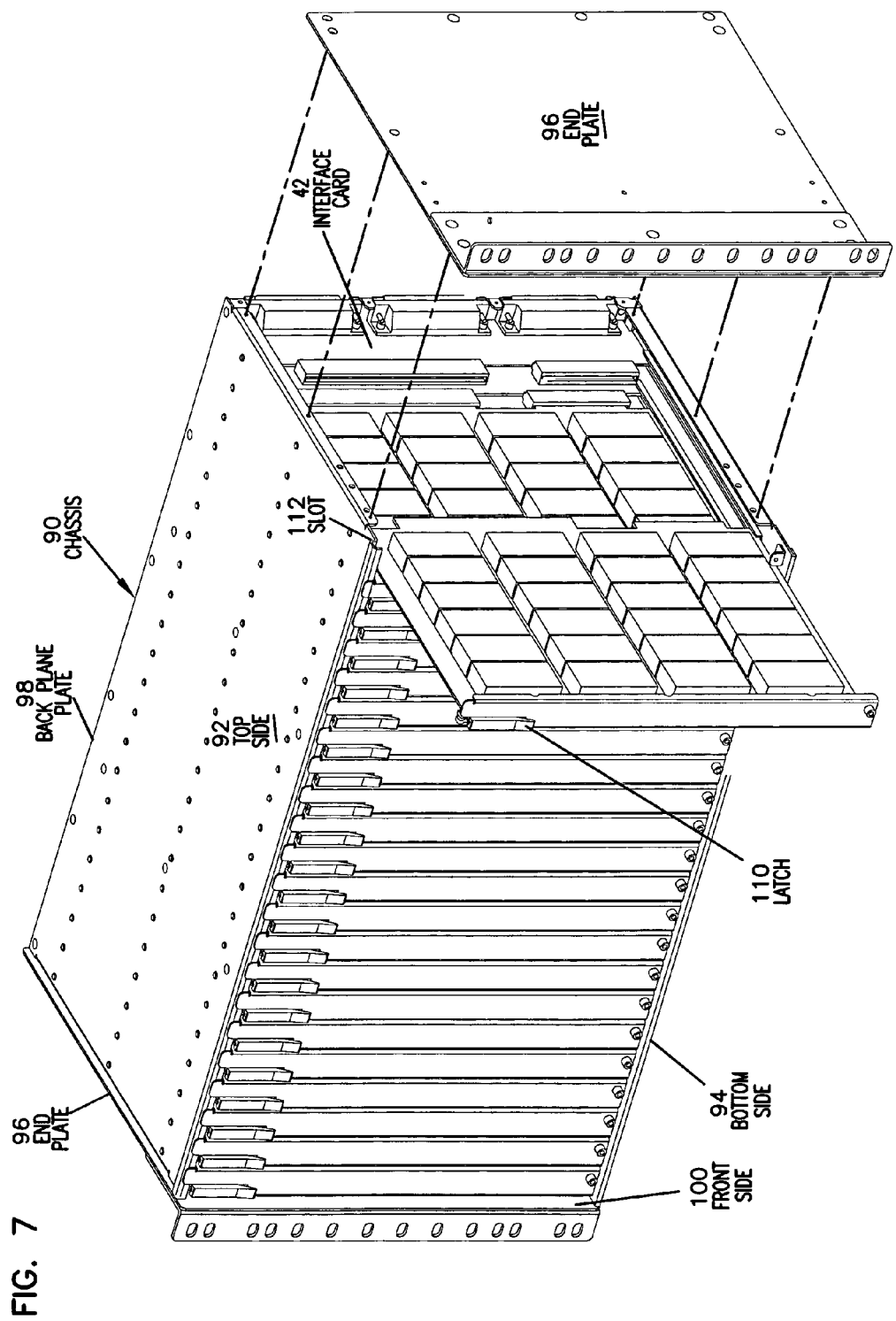
FIG. 7 is a perspective view of a splitter chassis constructed in accordance with the principles of the present invention, an endplate of the chassis has been removed and a splitter card has been slid from the chassis.
Figure 8:
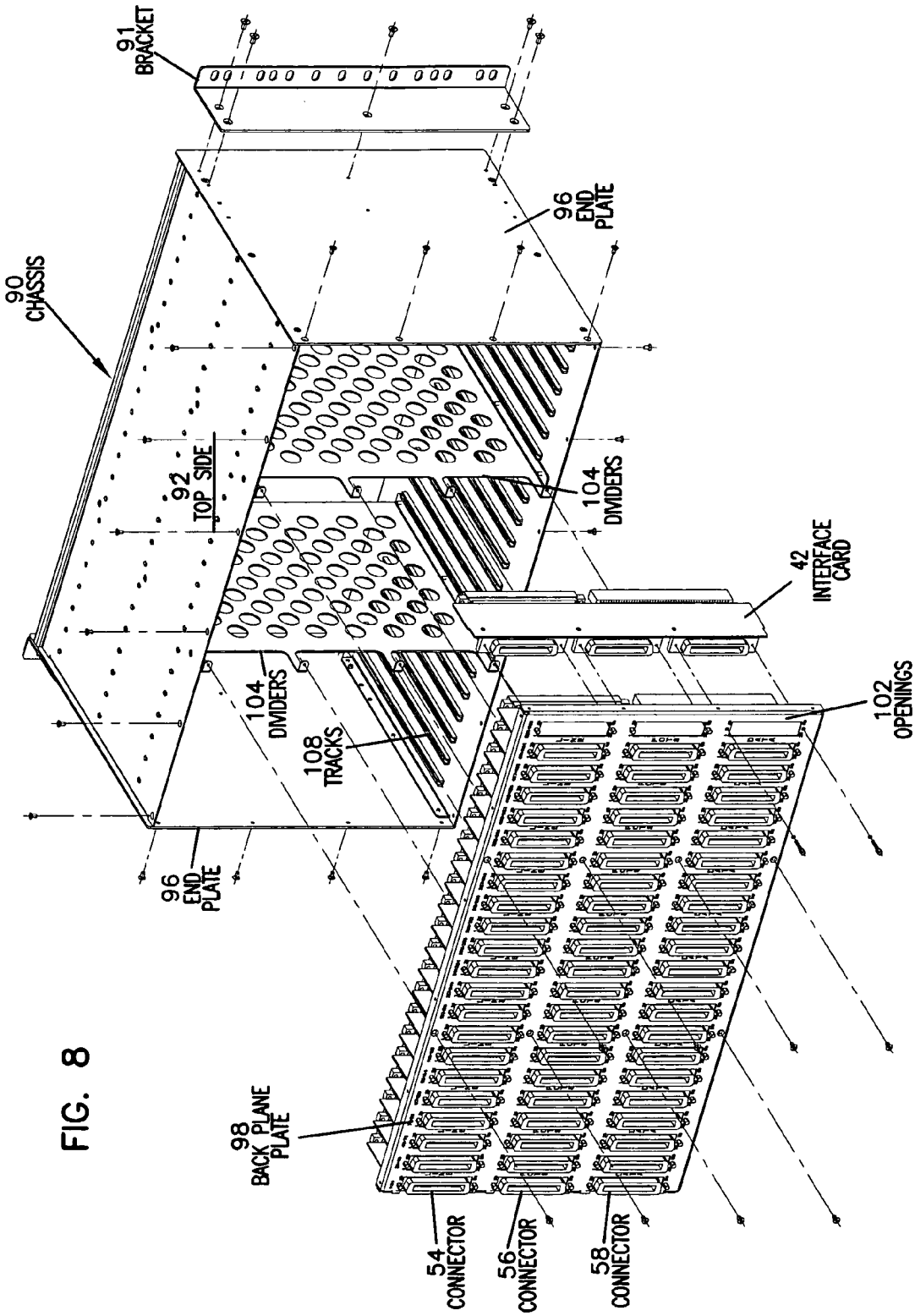
FIG. 8 is a rear perspective view of the splitter chassis of FIG. 7 with the back plane removed.

FIG. 7 illustrates a splitter chassis 90 constructed in accordance with the principles of the present invention. The chassis 90 is generally rectangular and includes a top side 92 positioned opposite from a bottom side 94. End plates 96 are provided for enclosing opposite ends of the chassis 90. A back plane plate 98 (as shown in FIG. 8) defines a back plane of the chassis 90, and a front side 100 of the chassis 90 is generally open. The chassis 90 also includes mounting brackets 91 (shown in FIG. 8) for connecting the chassis 90 to a structure such as a rack.

Figure 9:
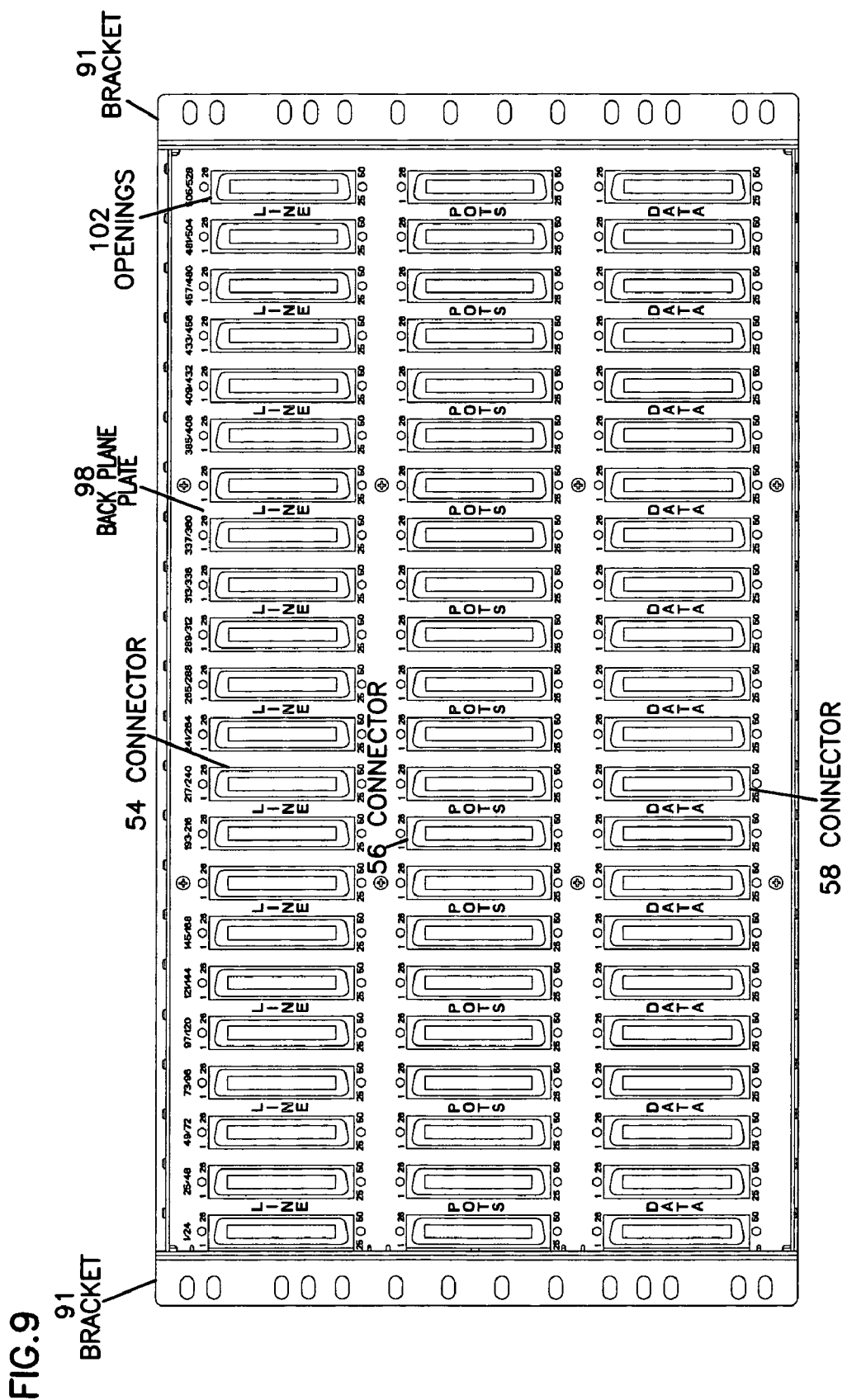
FIG. 9 is a rear view of the loaded splitter chassis of FIG. 7.

As best shown in FIG. 8, a plurality of the back plane interface cards 42 are preferably secured to the back plane plate 98 by conventional techniques (e.g., fasteners such as bolts or screws). The back plane plate 98 defines multiple columns of vertically spaced apart openings 102 sized for receiving the cable connectors 54, 56 and 58 of the interface cards 42. When the interface cards 42 are connected to the back plane plate 98, the connectors define an array of connectors as shown in FIG. 9.

Figure 11:
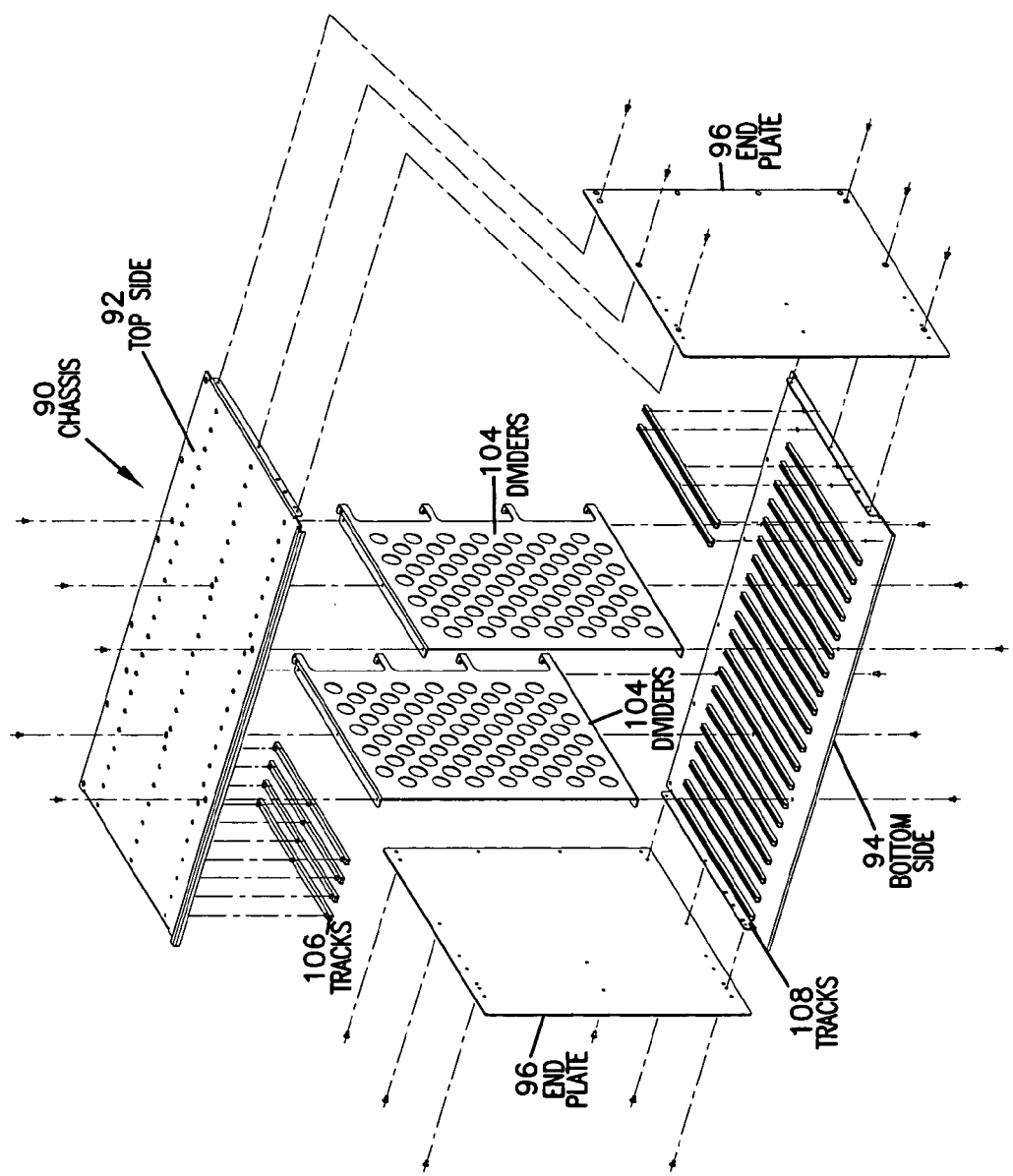
FIG. 11 is an exploded view of the splitter chassis of FIG. 7 with the splitter cards and the back plane interface cards removed.

Referring to FIG. 11, the chassis 90 includes intermediate dividers 104 that provide additional structural rigidity to the chassis 90. The chassis 90 also includes top and bottom tracks 106 and 108 respectively secured to the top side 92 and the bottom side 94 of the chassis 90. The top and the bottom tracks 106 and 108 oppose one another and define elongated slots that extend between the front and back sides of the chassis 90. As shown in FIG. 7, the splitter cards 44 are mounted within the chassis 90 by sliding the splitter cards 44 through the open front side 100 into the tracks 106 and 108. Preferably, top and bottom ends of the splitter cards 44 are respectively received within the upper and lower tracks 106 and 108. In this manner, the tracks function to hold the splitter cards in a parallel, slightly spaced apart relation relative to one another. Front latches 110 on the splitter cards 44 hook into a top slot 112 of the chassis to retain the splitter cards 44 within the chassis 90.

Figure 10:
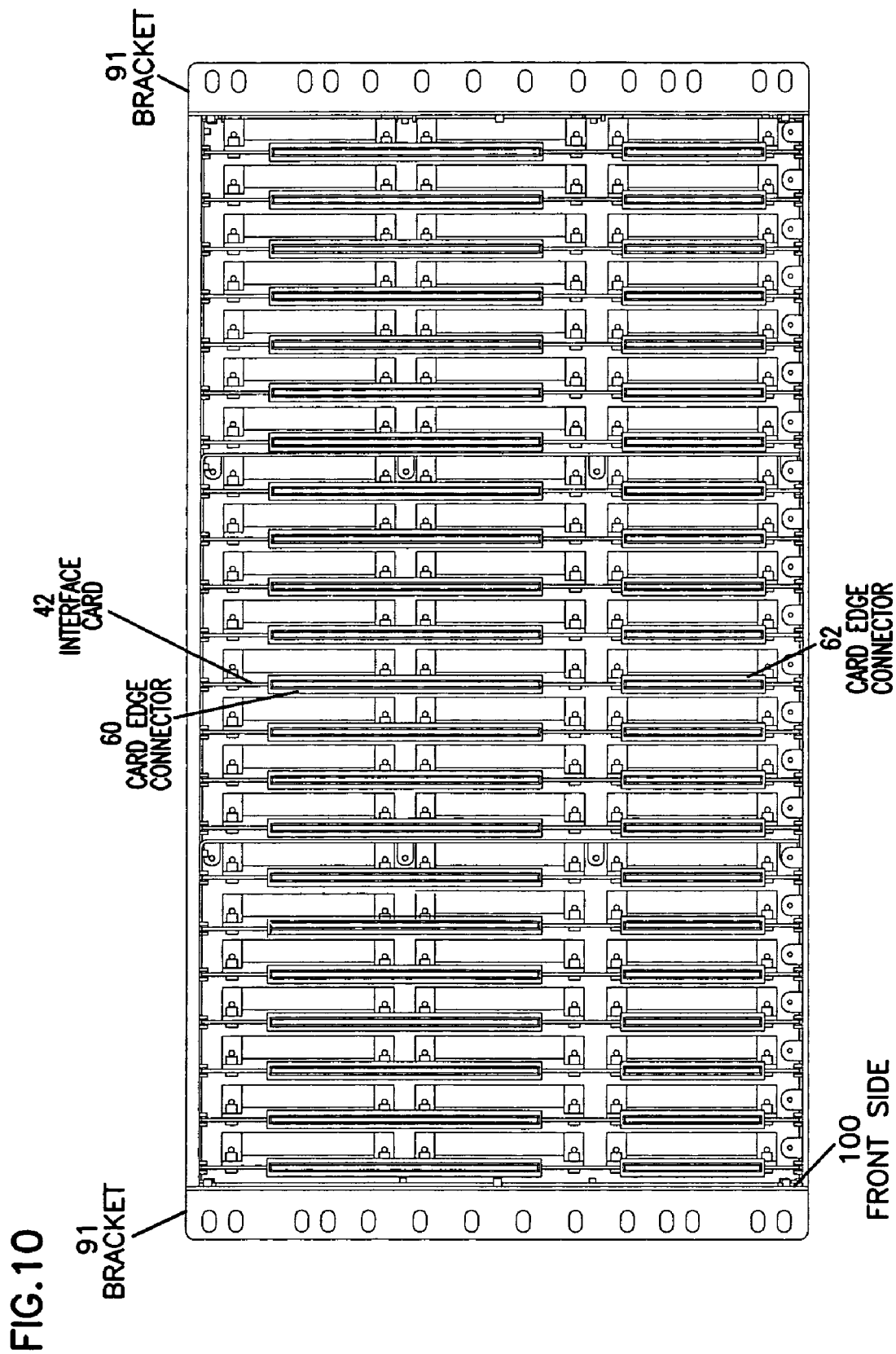
FIG. 10 is a front view of the loaded splitter chassis of FIG. 7.

As best shown in FIGS. 7 and 10, the back plane interface cards 42 are also mounted within the tracks 106 and 108. For example, as shown in FIG. 10, top and bottom edges of the interface cards 42 are received within the tracks 106 and 108. In this manner, the tracks 106 and 108 assist in holding the back plane interface cards 42 in a perpendicular relationship relative to the back plane plate 98. The top and bottom tracks 106 and 108 also assist in maintaining a generally uniform spacing between the interface cards 42. Preferably, each back plane interface card 42 is mounted in the same set of tracks as its corresponding splitter card 44. With such a configuration, the tracks 106 and 108 assist in providing registry between the interface cards 42 and the splitter cards 44.

Figure 12:
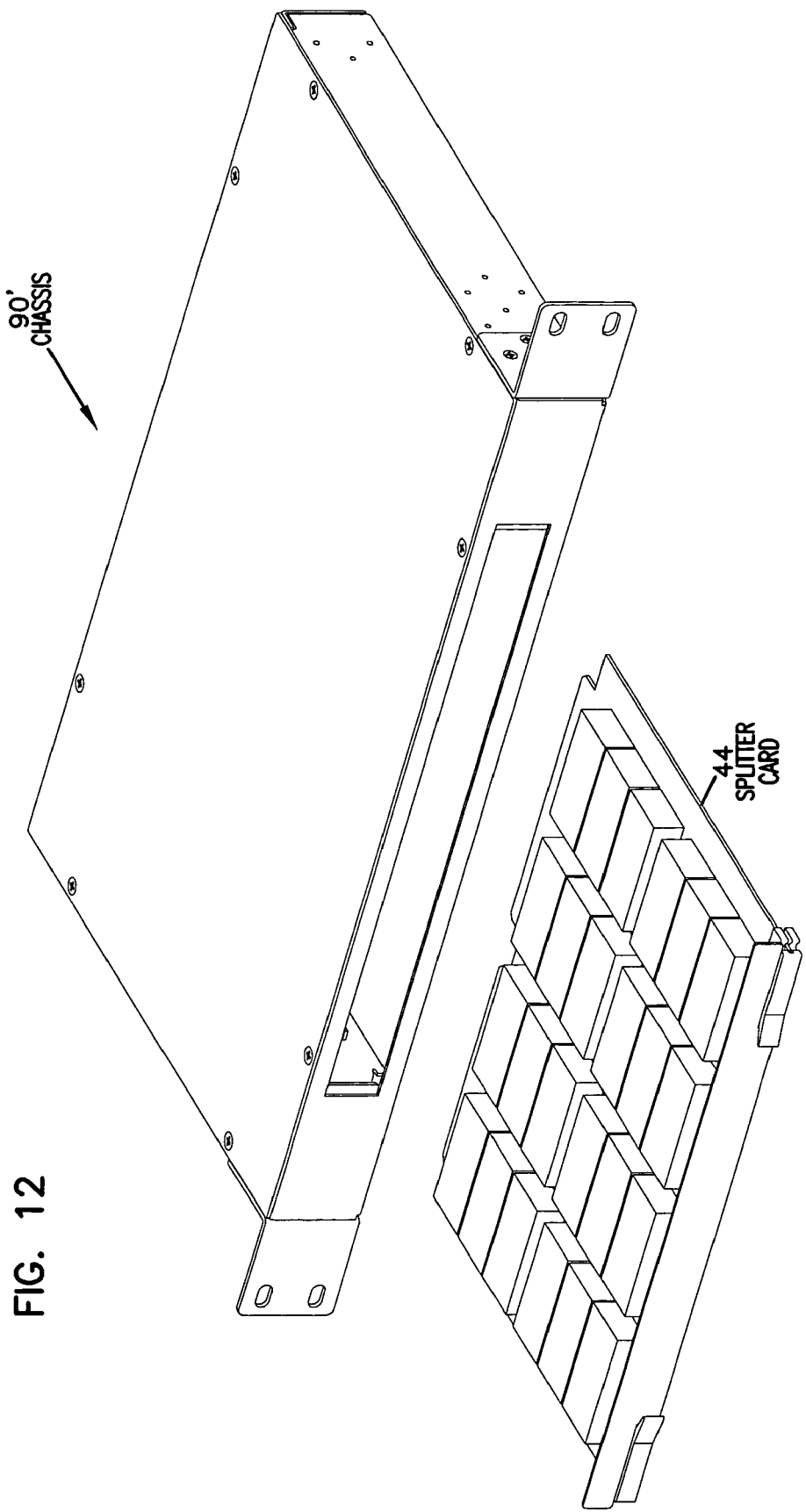
FIG. 12 is a front perspective view of another chassis constructed in accordance with the principles of the present invention.

FIGS. 12-14 illustrate an alternative chassis 90' constructed in accordance with the principles of the present invention. The chassis 90' has a rectangular shape and is sized for receiving a single splitter card 44 and a single back plane interface 42. Similar to the chassis of FIG. 7, the chassis 90' includes opposing tracks 106' and 108' for receiving the edges of the splitter card 44 and the interface card 42.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A telecommunications component comprising:
   a circuit board;
   a first multi-pair cable connector mounted on the circuit board for inputting twisted pair, mixed data and voice signals to the circuit board;
   a second multi-pair cable connector mounted on the circuit board for outputting twisted pair, voice signals from the circuit board;
   a third multi-pair cable connector mounted on the circuit board for outputting twisted pair, data signals or mixed data and voice signals from the circuit board;
   one or more card edge connectors connected to the circuit board, the one or more card edge connectors including:
      a group of normally closed contacts;
      a group of normally open contacts, all of the normally open contacts being grouped separately from the normally closed contacts;
   first tracings provided on the circuit board for connecting the first multi-pair cable connector to the normally closed contacts;
   second tracings provided on the circuit board for connecting the normally closed contacts to the second multi-pair cable connector;
   third tracings provided on the circuit board for connecting the normally open contacts to the third multi-pair cable connector;
   the tracings being positioned such that none of the third tracings on the circuit board cross-over any of the first or second tracings; and
   a splitter card having one or more card edge connectors that connect to the one or more card edge connectors of the circuit board, the splitter card including a plurality of splitters for splitting the mixed data and voice signals into the data signals and the voice signals.

2. The telecommunications component of claim 1, wherein the splitters comprise POTS splitters.

3. The telecommunications component of claim 2, wherein the splitter card includes at least 24 of the POTS splitters.

4. The telecommunications component of claim 1, wherein the one or more card edge connectors of the circuit board include a first card edge connector and a separate second card edge connector, the first card edge connector including the normally closed contacts and the second card edge connector including the normally open contacts.

5. The telecommunications component of claim 1, further comprising a chassis including a reference back plane at which the first, second and third multi-pair cable connectors are positioned, the circuit board being aligned generally at a perpendicular orientation relative to the reference back plane.

6. The telecommunications component of claim 5, wherein the splitter card is aligned at a generally parallel orientation relative to the circuit board when the splitter card and the circuit board are connected by the one or more card edge connectors.

7. The telecommunications component of claim 5, wherein the chassis includes opposing slots, wherein the circuit board is mounted in the slots.

8. The telecommunications component of claim 7, wherein the splitter card and the circuit board are mounted in the same opposing slots when the splitter card and the circuit board are connected by the card edge connectors.

9. A telecommunications component comprising:
   a chassis defining a reference back plane;
   an interface card mounted at the reference back plane of the chassis, the interface card including:
      a circuit board positioned at an orientation generally perpendicular with respect to the back plane;
      a first multi-pair cable connector mounted on the circuit board and positioned at the back plane for inputting twisted pair, mixed data and voice signals to the circuit board;
      a second multi-pair cable connector mounted on the circuit board and positioned at the back plane for outputting twisted pair, voice signals from the circuit board;
      a third multi-pair cable connector mounted on the circuit board and positioned at the back plane for outputting twisted pair, data signals or mixed data and voice signals from the circuit board;
      one or more card edge connectors connected to the circuit board, the one or more card edge connectors including normally closed contacts and normally open contacts;
      first tracings provided on the circuit board for connecting the first multi-pair cable connector to the normally closed contacts;
      second tracings provided on the circuit board for connecting the normally closed contacts to the second multi-pair cable connector; and
      third tracings provided on the circuit board for connecting the normally open contacts to the third multi-pair cable connector; and
   a splitter card having one or more card edge connectors that connect to the one or more card edge connectors of the circuit board, the splitter card including a plurality of splitters for splitting the mixed data and voice signals into the data signals and the voice signals, the splitter card being aligned at a generally parallel orientation relative to the circuit board when the splitter card is connected to the circuit board.

10. The telecommunications component of claim 9, wherein the splitters comprise POTS splitters.

11. The telecommunications component of claim 10, wherein the splitter card includes at least 24 of the POTS splitters.

12. The telecommunications component of claim 9, wherein the chassis includes opposing slots, wherein the circuit board is mounted in the slots.

13. The telecommunications component of claim 12, wherein the splitter card and the circuit board are mounted in the same opposing slots when the circuit board and the splitter card are interconnected by the card edge connectors.

14. The telecommunications component of claim 9, wherein a plurality of the interface cards are mounted within the chassis.

15. The telecommunications component of claim 9, wherein the chassis is sized to hold a single one of the interface card.

16. The telecommunications component of claim 9, wherein all of the normally closed contacts are provided on a first card edge connector of the circuit board, and all of the normally open contacts are provided on a separate second card edge connector of the circuit board.

17. The telecommunications component of claim 16, wherein the splitter card has first and second card edge connectors that connect to the first and second card edge connectors of the circuit board, the splitter card being aligned at the generally parallel orientation relative to the circuit board when the splitter card and the circuit board are connected by the card edge connectors.

18. The telecommunications component of claim 16, wherein the splitter card has first and second card edge connectors that connect to the first and second card edge connectors of the circuit board, the splitter card and the circuit board being mounted in a common pair of opposing slots defined by the chassis.

19. A telecommunications component comprising:
a circuit board;
a first multi-pair cable connector for inputting twisted pair, mixed data and voice signals to the circuit board;
a second multi-pair cable connector for outputting twisted pair, voice signals from the circuit board;
a third multi-pair cable connector for outputting twisted pair, data signals or mixed data and voice signals from the circuit board;
one or more card edge connectors connected to the circuit board, the one or more card edge connectors including:
a group of normally closed contacts;
a group of normally open contacts, all of the normally open contacts being grouped separately from the normally closed contacts;
first tracings provided on the circuit board for connecting the first multi-pair cable connector to the normally closed contacts;
second tracings provided on the circuit board for connecting the normally closed contacts to the second multi-pair cable connector;
third tracings provided on the circuit board for connecting the normally open contacts to the third multi-pair cable connector;
the tracings being positioned such that none of the third tracings on the circuit board cross-over any of the first or second tracings; and
a splitter card having one or more card edge connectors that connect to the one or more card edge connectors of the circuit board, the splitter card including at least 24 POTS splitters for splitting the mixed data and voice signals into the data signals and the voice signals.

20. A telecommunications component comprising:
a circuit board;
a first multi-pair cable connector for inputting twisted pair, mixed data and voice signals to the circuit board;
a second multi-pair cable connector for outputting twisted pair, voice signals from the circuit board;
a third multi-pair cable connector for outputting twisted pair, data signals or mixed data and voice signals from the circuit board;
a first card edge connector connected to the circuit board, the first card edge connector including a group of normally closed contacts;
a separate second card edge connector connected to the circuit board, the second card edge connector including a group of normally open contacts;
first tracings provided on the circuit board for connecting the first multi-pair cable connector to the normally closed contacts;
second tracings provided on the circuit board for connecting the normally closed contacts to the second multi-pair cable connector;
third tracings provided on the circuit board for connecting the normally open contacts to the third multi-pair cable connector;
the tracings being positioned such that none of the third tracings on the circuit board cross-over any of the first or second tracings; and
a splitter card having one or more card edge connectors that connect to the first and second card edge connectors of the circuit board, the splitter card including a plurality of splitters for splitting the mixed data and voice signals into the data signals and the voice signals.

21. The telecommunications component of claim 20, wherein the splitters comprise POTS splitters.

22. The telecommunications component of claim 21, wherein the splitter card includes at least 24 of the POTS splitters.

23. A telecommunications component comprising:
a chassis including a reference back plane;
a circuit board aligned generally at a perpendicular orientation relative to the reference back plane;
a first multi-pair cable connector positioned at the reference back plane for inputting twisted pair, mixed data and voice signals to the circuit board;
a second multi-pair cable connector positioned at the reference back plane for outputting twisted pair, voice signals from the circuit board;
a third multi-pair cable connector positioned at the reference back plane for outputting twisted pair, data signals or mixed data and voice signals from the circuit board;
one or more card edge connectors connected to the circuit board, the one or more card edge connectors including:
a group of normally closed contacts;
a group of normally open contacts, all of the normally open contacts being grouped separately from the normally closed contacts;
first tracings provided on the circuit board for connecting the first multi-pair cable connector to the normally closed contacts;
second tracings provided on the circuit board for connecting the normally closed contacts to the second multi-pair cable connector;
third tracings provided on the circuit board for connecting the normally open contacts to the third multi-pair cable connector;
the tracings being positioned such that none of the third tracings on the circuit board cross-over any of the first or second tracings; and
a splitter card having one or more card edge connectors that connect to the one or more card edge connectors of the circuit board, the splitter card including at least 24 POTS splitters for splitting the mixed data and voice signals into the data signals and the voice signals, the splitter card being aligned at a generally parallel orientation relative to the circuit board when the splitter card is connected to the one or more card edge connectors.

24. A telecommunications component comprising:
a chassis defining a reference back plane;
an interface card mounted at the reference back plane of the chassis, the interface card including:
   a circuit board positioned at an orientation generally perpendicular with respect to the back plane;
   a first multi-pair cable connector positioned at the back plane for inputting twisted pair, mixed data and voice signals to the circuit board;
   a second multi-pair cable connector positioned at the back plane for outputting twisted pair, voice signals from the circuit board;
   a third multi-pair cable connector positioned at the back plane for outputting twisted pair, data signals or mixed data and voice signals from the circuit board;
   one or more card edge connectors connected to the circuit board, the one or more card edge connectors including normally closed contacts and normally open contacts;
   first tracings provided on the circuit board for connecting the first multi-pair cable connector to the normally closed contacts;
   second tracings provided on the circuit board for connecting the normally closed contacts to the second multi-pair cable connector;
   third tracings provided on the circuit board for connecting the normally open contacts to the third multi-pair cable connector; and
   a splitter card having one or more card edge connectors that connect to the one or more card edge connectors of the circuit board, the splitter card including at least 24 POTS splitters for splitting the mixed data and voice signals into the data signals and the voice signals, the splitter card being aligned at a generally parallel orientation relative to the circuit board when the splitter card is connected to the one or more card edge connectors.

25. A telecommunications component comprising:
a chassis defining a reference back plane;
an interface card mounted at the reference back plane of the chassis, the interface card including:
   a circuit board positioned at an orientation generally perpendicular with respect to the back plane;
   a first multi-pair cable connector positioned at the back plane for inputting twisted pair, mixed data and voice signals to the circuit board;
   a second multi-pair cable connector positioned at the back plane for outputting twisted pair, voice signals from the circuit board;
   a third multi-pair cable connector positioned at the back plane for outputting twisted pair, data signals or mixed data and voice signals from the circuit board;
   one or more card edge connectors connected to the circuit board, the one or more card edge connectors including normally closed contacts and normally open contacts, wherein all of the normally closed contacts are provided on a first card edge connector, and all of the normally open contacts are provided on a separate second card edge connector;
   first tracings provided on the circuit board for connecting the first multi-pair cable connector to the normally closed contacts;
   second tracings provided on the circuit board for connecting the normally closed contacts to the second multi-pair cable connector;
   third tracings provided on the circuit board for connecting the normally open contacts to the third multi-pair cable connector; and
   a splitter card having one or more card edge connectors that connect to the first and second card edge connectors, the splitter card including a plurality of splitters for splitting the mixed data and voice signals into the data signals and the voice signals, the splitter card being aligned at a generally parallel orientation relative to the circuit board when the splitter card is connected to the first and second card edge connectors.

26. The telecommunications component of claim 25, wherein the splitters comprise POTS splitters.

27. The telecommunications component of claim 26, wherein the splitter card includes at least 24 of the POTS splitters.

28. The telecommunications component of claim 25, wherein the splitter card and the circuit board are mounted in a common pair of opposing slots defined by the chassis.

29. A telecommunications component comprising:
a circuit board;
a first multi-pair cable connector mounted on the circuit board for inputting twisted pair, mixed data and voice signals to the circuit board;
a second multi-pair cable connector mounted on the circuit board for outputting twisted pair, voice signals from the circuit board;
a third multi-pair cable connector mounted on the circuit board for outputting twisted pair, data signals or mixed data and voice signals from the circuit board;
one or more card edge connectors connected to the circuit board, the one or more card edge connectors including:
   a group of normally closed contacts;
   a group of normally open contacts, all of the normally open contacts being grouped separately from the normally closed contacts;
the one or more card edge connectors including a first card edge connector and a separate second card edge connector, the first card edge connector including the normally closed contacts and the second card edge connector including the normally open contacts
first tracings provided on the circuit board for connecting the first multi-pair cable connector to the normally closed contacts;
second tracings provided on the circuit board for connecting the normally closed contacts to the second multi-pair cable connector;
third tracings provided on the circuit board for connecting the normally open contacts to the third multi-pair cable connector;
the tracings being positioned such that none of the third tracings on the circuit board cross-over any of the first or second tracings; and
a splitter card having one or more card edge connectors that connect to the first and second card edge connectors of the circuit board, the splitter card including a plurality of splitters for splitting the mixed data and voice signals into the data signals and the voice signals.

30. The telecommunications component of claim 29, wherein the splitters comprise POTS splitters.

31. The telecommunications component of claim 30, wherein the splitter card includes at least 24 of the POTS splitters.

32. A telecommunications component comprising:
a chassis defining a reference back plane, the chassis including opposing slots;
an interface card mounted at the reference back plane of the chassis, the interface card including:
- a circuit board positioned at an orientation generally perpendicular with respect to the back plane, the circuit board being mounted in the opposing slots of the chassis;
- a first multi-pair cable connector mounted on the circuit board and positioned at the back plane for inputting twisted pair, mixed data and voice signals to the circuit board;
- a second multi-pair cable connector mounted on the circuit board and positioned at the back plane for outputting twisted pair, voice signals from the circuit board;
- a third multi-pair cable connector mounted on the circuit board and positioned at the back plane for outputting twisted pair, data signals or mixed data and voice signals from the circuit board;
- one or more card edge connectors connected to the circuit board, the one or more card edge connectors including normally closed contacts and normally open contacts;
- first tracings provided on the circuit board for connecting the first multi-pair cable connector to the normally closed contacts;
- second tracings provided on the circuit board for connecting the normally closed contacts to the second multi-pair cable connector;
- third tracings provided on the circuit board for connecting the normally open contacts to the third multi-pair cable connector; and
- a splitter card having one or more card edge connectors that connect to the one or more card edge connectors of the circuit board, the splitter card including a plurality of splitters for splitting the mixed data and voice signals into the data signals and the voice signals, the splitter card and the circuit board being mounted in the same opposing slots when the circuit board and the splitter card are interconnected by the card edge connectors.

33. The telecommunications component of claim 32, wherein all of the normally closed contacts are provided on a first card edge connector of the circuit board, and all of the normally open contacts are provided on a separate second card edge connector of the circuit board.

34. The telecommunications component of claim 33, wherein the splitter card has first and second card edge connectors that connect to the first and second card edge connectors of the circuit board.

35. A telecommunications component comprising:
a chassis defining a reference back plane;
an interface card mounted at the reference back plane of the chassis, the interface card including:
- a circuit board positioned at an orientation generally perpendicular with respect to the back plane;
- a first multi-pair cable connector positioned at the back plane for inputting twisted pair, mixed data and voice signals to the circuit board;
- a second multi-pair cable connector positioned at the back plane for outputting twisted pair, voice signals from the circuit board;
- a third multi-pair cable connector positioned at the back plane for outputting twisted pair, data signals or mixed data and voice signals from the circuit board;
- one or more card edge connectors connected to the circuit board, the one or more card edge connectors including normally closed contacts and normally open contacts, wherein all of the normally closed contacts are provided on a first card edge connector, and all of the normally open contacts are provided on a separate second card edge connector;
- first tracings provided on the circuit board for connecting the first multi-pair cable connector to the normally closed contacts;
- second tracings provided on the circuit board for connecting the normally closed contacts to the second multi-pair cable connector;
- third tracings provided on the circuit board for connecting the normally open contacts to the third multi-pair cable connector; and
- a splitter card having one or more card edge connectors that connect to the first and second card edge connectors, the splitter card including a plurality of splitters for splitting the mixed data and voice signals into the data signals and the voice signals, the splitter card and the circuit board being mounted in a common pair of opposing slots defined by the chassis.

* * * * *